United States Patent [19]

Chow

[11] 4,091,414
[45] May 23, 1978

[54] FORWARD LOCKING INFRARED VIDEO PROCESSING SYSTEM HAVING A SCENE DYNAMIC RANGE EXPANDER

[75] Inventor: Sen-Te Chow, Alexandria, Va.

[73] Assignee: The United States of America as represented by the Secretary of the Army, Washington, D.C.

[21] Appl. No.: 763,752

[22] Filed: Jan. 28, 1977

[51] Int. Cl.² .............................................. H04N 5/14
[52] U.S. Cl. .................................... 358/174; 358/166; 358/113
[58] Field of Search ................. 358/113, 160, 166, 174

[56] References Cited

U.S. PATENT DOCUMENTS 3,975,586  8/1976  Chow ................................... 358/160
4,038,688  7/1977  Chow ................................... 358/174

*Primary Examiner*—Howard W. Britton
*Attorney, Agent, or Firm*—Nathan Edelberg; Max L. Harwell; Robert P. Gibson

[57] ABSTRACT

A means for expanding the dynamic range of a forward looking infrared (FLIR) video processing system by inserting an automatic low frequency gain limiting and first post amplifier circuit means at the output of the preamplifiers in each video channel to provide variable pedestal limiting of the low frequency components of the video signal. The automatic low frequency gain limiting and first post amplifier circuit means compresses the pedestal of signals derived from smoke, dust, or fire to arbitrary small levels to preserve sufficient dynamic range for enhancing the high frequency detail signal riding on the pedestals at a display.

5 Claims, 7 Drawing Figures

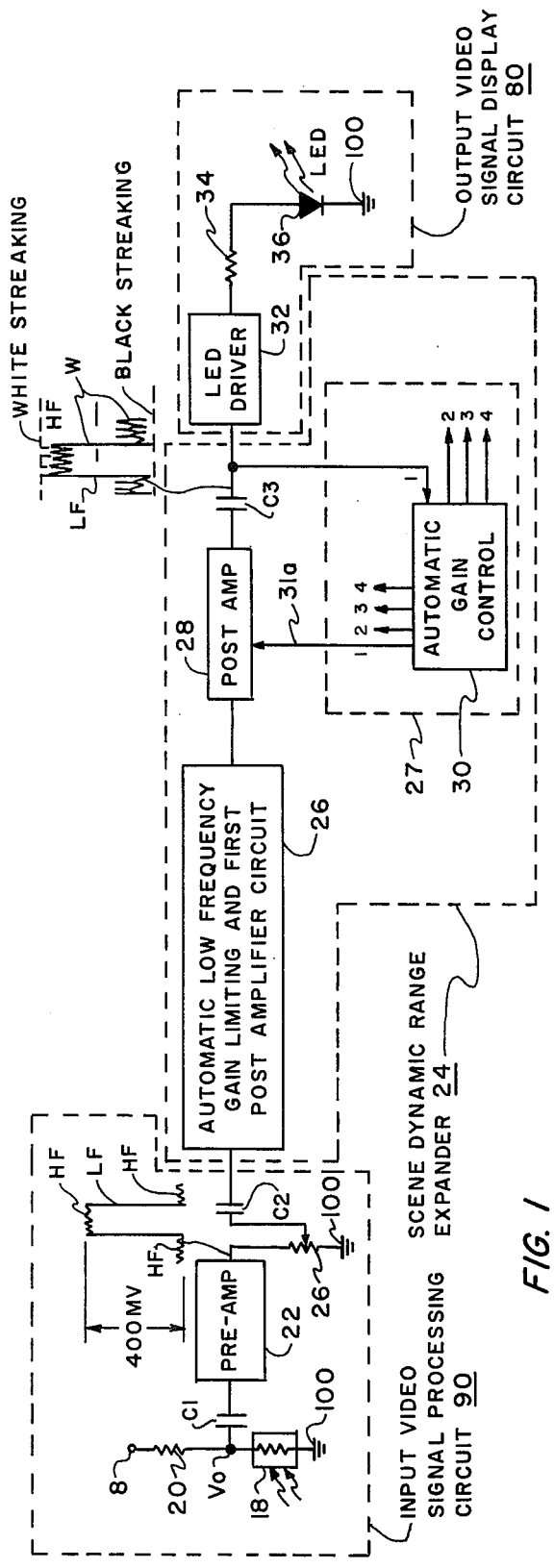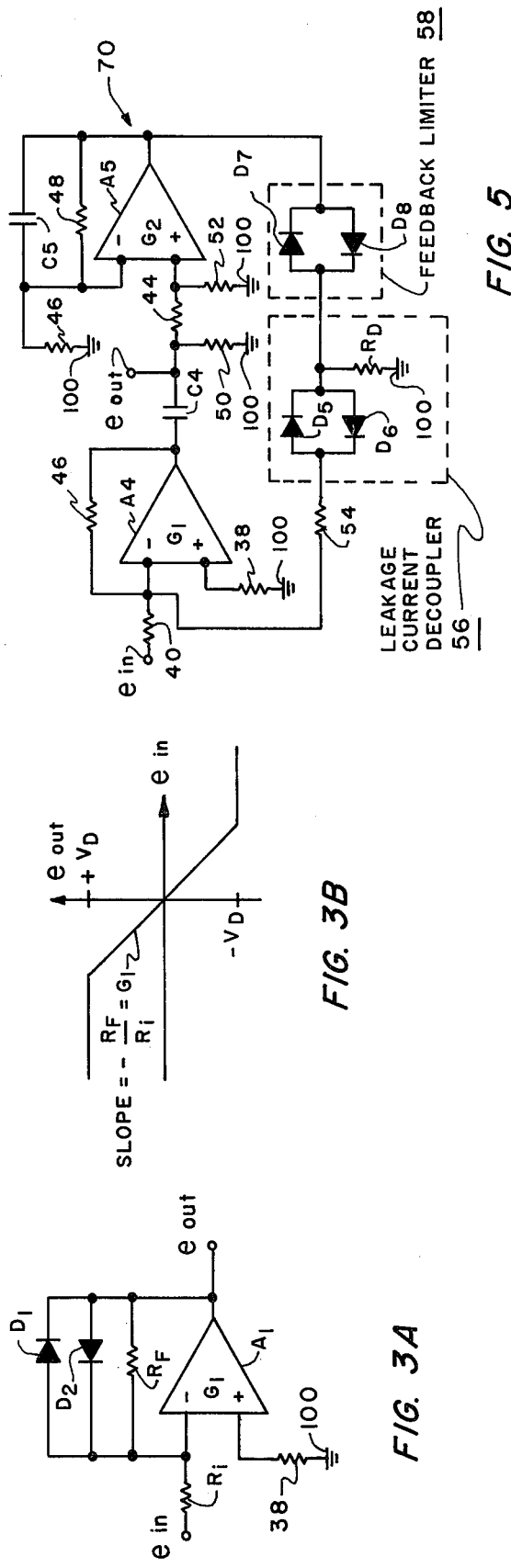

FORWARD LOCKING INFRARED VIDEO PROCESSING SYSTEM HAVING A SCENE DYNAMIC RANGE EXPANDER

The invention described herein may be manufactured, used, and licensed by the U.S. Government for governmental purposes without the payment of any royalties thereon.

CROSS-REFERENCED APPLICATIONS

This application is related to U.S. Pat. No. 3,971,886 issued to the present inventor and to copending application Ser. No. 650,483, entitled "Automatic Low Frequency Gain Limiting by Addition Method in Video Processing System" by the present inventor and coinventor, Earl M. Thomas, now U.S. Pat. No. 4,038,688.

BACKGROUND OF THE INVENTION

This invention is in the field of AC coupled FLIR video processing systems. A problem existing in these video processing systems is that of insufficient dynamic range because of smoke, dust, fire or background signals that are saturated at the output of the preamplifier or within the post amplifiers.

Some means is needed to vary the height of the pedestal (or low frequency) signals such that the perceivable scene dynamic range is enlarged to preserve the details (high frequency) signal at the display when the preamplifier output signal is very large.

It is an object of the present invention to provide a common module FLIR system with a higher degree of hands-off operation by replacing the existing manual gain control with an automatic gain control (AGC) circuit.

It is a further object to provide an automatic low frequency gain limiting circuit that expands the perceivable scene dynamic range and resolve the image streaking problems for airborne applications.

The present invention solves the above problems.

SUMMARY

The present invention comprises an electronic means that is inserted in the video channels between an input video signal processing circuit and an output video signal display circuit, and specifically an automatic low frequency gain limiting and first post amplifier circuit that is inserted in each of a plurality of video channels between the preamplifier and a second post amplifier to provide automatic low frequency gain limiting of the low frequency components of the input video signal in each video channel to preserve sufficient dynamic range for enhancing detail signals. The electronic means is further comprised of an automatic gain control circuit that is connected between the outputs of a selected number of the second post amplifiers and their internal bias circuits for applying gain control signals back to the respective selected number of second post amplifiers. By the automatic low frequency gain limiting and first post amplifier circuit having the first post amplifier therein, both the package size and power dissipation will be reduced. The automatic low frequency gain limiting and first post amplifier circuit comprises a first post amplifier cascaded with a variable pedestal limiting amplifier and a feedback limiter circuit connected between the output of the variable pedestal limiting amplifier and the input to the first post amplifier such that the large amplitude low frequency output signal from the first post amplifier is limited to below the saturation level. The gain of the variable pedestal limiting amplifier may be set variable. Therefore, the output pedestal from this amplifier is also variable. A leakage current decoupling circuit is included in the feedback limiter circuit in order to limit the current fed back into the input of the first post amplifier.

Some of the features of the present invention are that the perceivable scene dynamic range is increased to 71 decibels, an observer is able to detect targets behind smoke, dust, or fire, high voltage biasing is not required, and there is a large degree of automatic operation.

BRIEF DESCRIPTION OF THE DRAWINGS

FIG. 1 illustrates in a partial block diagram a common module video channel with the present scene dynamic range expander;

FIGS. 3A and 3B respectively show a typical amplifier circuit having a feedback diode limiter and the resulting output limiting level of the diode forward threshold voltage;

FIG. 5 illustrates by electrical schematic the cascade feedback diode limiter of the present invention.

DETAILED DESCRIPTION OF THE PREFERRED EMBODIMENT

Figure 2:
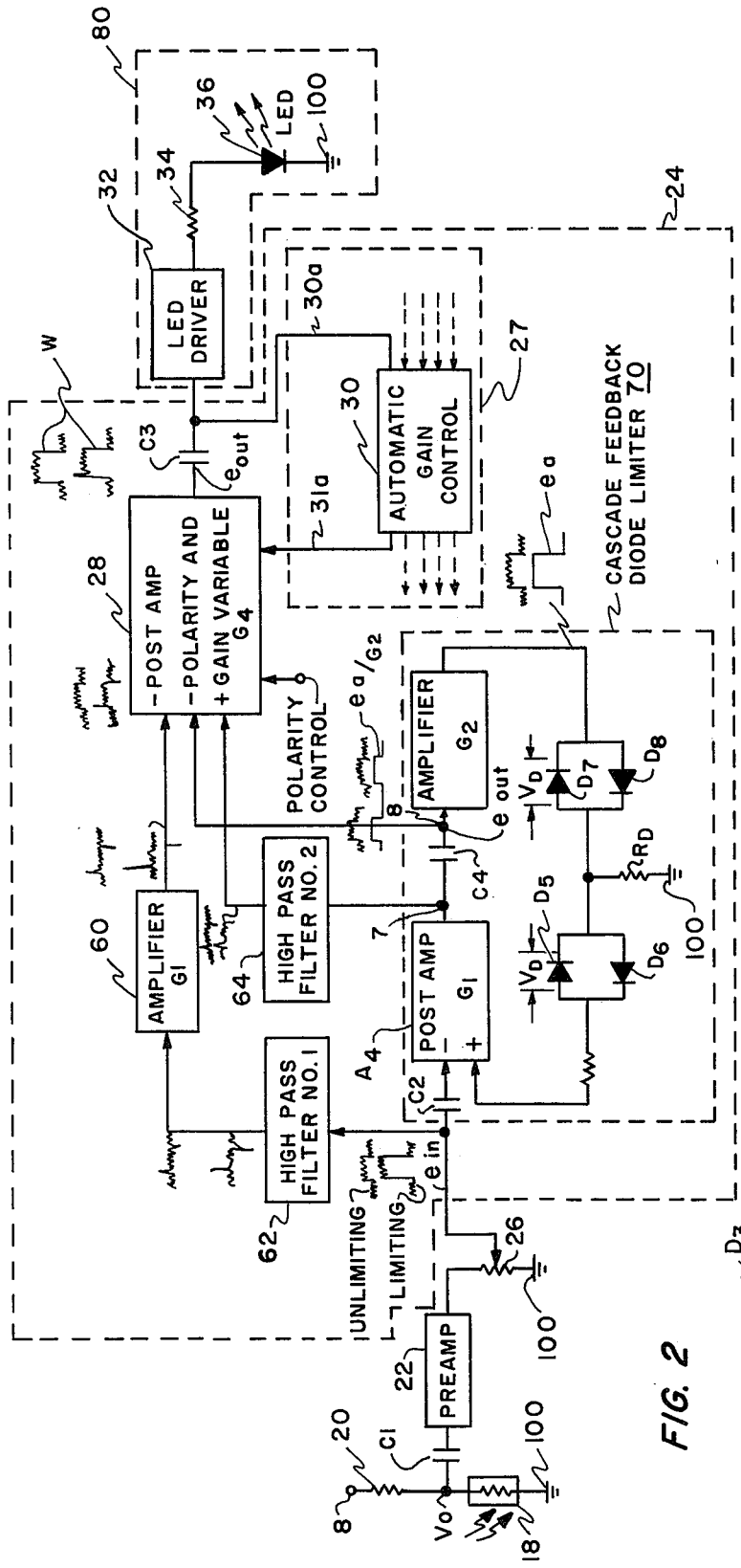
FIG. 2 illustrates an electrical schematic of the common module video channel showing the present scene dynamic range expander.

Refer now to FIG. 1 for a brief discussion of how the scene dynamic range expander circuit 24 operates in the video channels of an AC coupled FLIR video processing system. Circuit 24 is comprised of an automatic low frequency gain limiting and first post amplifier circuit 26 and a second post amplifier 28 in each of the video channels, and a single unit AGC circuit 30 that controls the bias voltages to a select number of the second post amplifiers 28 for overall display control of an output signal therefrom to an output video signal display circuit 80. First, the input video signal that is applied to the input video signal processing circuit 90 comprises high frequency (HF) detail signals mixed with low frequency (LF) pedestal components. When the amplitude of the LF pedestal component exceeds a certain level, the fire and background signals become saturated somewhere within the video processor chain, indicating that the LF pedestal is outside its dynamic range. It was found that the fire and background signals have sometimes become saturated at the output of the second post amplifier 28. The LF pedestal is shown at the output of the preamplifier 22 as 400 millivolts only as an example, but may be as high as 1 volt peak-to-peak. In airborne operations, the AC coupled FLIR video processing system is also subject to streaking problems caused by signal suppression. The waveform W, shown at the output of the second post amplifier 28, is a reproduction of the large signal at the output of the preamplifier 22 that has been limited by the scene dynamic range expander 24 to the linear dynamic range between the white streaking level and the black streaking level. Conversely, should the system gain be below a certain level, an automatic gain control circuit 30 samples the amplitude of W at the output of a selected sequential number of the second post amplifiers 28 and is fed to circuit 30 by leads 30a whereupon circuit 30 automatically increases the post amplifier 28 gain to the maximum dynamic range of the display. It should be noted that waveform W represents only the largest amplitude signal with all other signals being equally amplified in circuit 30 but amplified from a smaller signal than W. The signal sampling for the circuit 30 may be performed only at a preselected number of video channels, say three video channels per sample, and then the sampled signal may be multiplexed out into every third one of the second post amplifiers by one of leads 30a to circuit 30 and one of leads 31a to 28. The gain control signal to the selected number of the post amplifiers 28 passes through leads 31a. Leads 30a and 31a are shown numbered 1 through 4 for convenience, but of course are not limited to that number since there may be 500 or more individual video channels. This type of automatic gain control of an amplifier is well known in the art.

The operation of the present circuit is as follows. The incoming signal is detected by a detector 18 that is placed in series with a bias resistor 20 between a ground terminal 100 and a detector bias voltage. Capacitor C1 couples the detected video signal $V_o$ directly to the input of preamplifier 22. A potentiometer 26 and capacitor C2 couples the amplified output signal from the preamplifier 22 into the present scene dynamic range expander 24. The above mentioned detecting of an input signal $V_o$ and coupling into and out of the preamplifier 22 into the input to the scene dynamic range expander 24 is conventional. Also, the output video signal display circuit 80, which may be comprised of light emitting diode (LED) driver 32, resistor 34, and an output display shown as one LED 36 of an LED array which processes signal W, is conventional.

The specific scene dynamic range expander 24 may be used with the AC coupled FLIR video process system between the input video signal processing circuit 90 and the output video signal display circuit 80 in smoke, dust, and fire type environments and yet maintain sight of say a tank or an army personnel carrier moving behind the smoke, dust, or fire. Refer to the electrical schematic of FIG. 1 for an explanation of the operation of circuit 24. Please note that two waveforms are presented, one immediately over the other, throughout circuit 24. The lower waveform represents a signal that exceeds the dynamic range of the video processing system. This is known as the limiting mode signal. The unlimiting mode signal is shown throughout as being directly above the limiting mode signal.

Previous, each video channel of an AC coupled FLIR video processing systems had two post amplifiers between the preamplifier and the display drives. In this invention, the first post amplifier is a part of circuit 26. Circuit 26 limits the LF component of a high frequency detail contained low amplitude pedestal signal at the output of circuit 26 to a level within the dynamic range of the AC coupled FLIR video processing system. Also, AGC circuit 30 samples a selected number of outputs from the second post amplifiers 28 and, if the largest sampled signals in one field is below a determined minimum level, circuit 30 increases the gain of that second post amplifier 28 until it reaches a level that is the maximum display dynamic range which is represented by waveform W. With the operation of the AGC circuit 30 and post amplifier 28 cooperating with the operation of circuit 26, the signal W that is applied to the output video signal display 80 is the largest sampled signal that is always within the dynamic range of the AC coupled video system and the high frequency detail signature of a scene under observation is observable at the display.

FIG. 3A shows a typical amplifier $A_1$ having a back-to-back diode feedback limiter comprised of the parallel network of diodes D1 and D2 and feedback resistor $R_F$ connected between the output and the negative input terminals of the amplifier. FIG. 3B illustrates the resulting output level voltage $e_{out}$ versus the input voltage $e_{in}$ of the amplifier circuit of FIG. 3A. The output level for $e_{out}$ is the diode forward threshold voltage $V_D$. The voltage $V_D$ would be too high to operate in circuit 26. This problem may be partly alleviated by adding a second amplifier in cascade with the feedback limiter of FIG. 3A. The cascaded amplifiers limiter is shown in FIG. 4A.

Figure 4B:
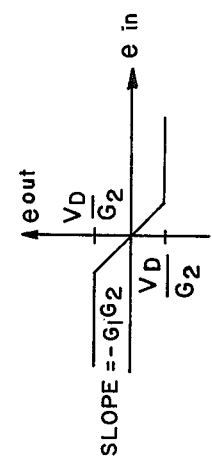
FIGS. 4A and 4B respectively show a typical two amplifier cascade feed back limiter and the resulting lowered output limiting level of the forward threshold voltage divided by the gain of the second amplifier.
Figure 4A:
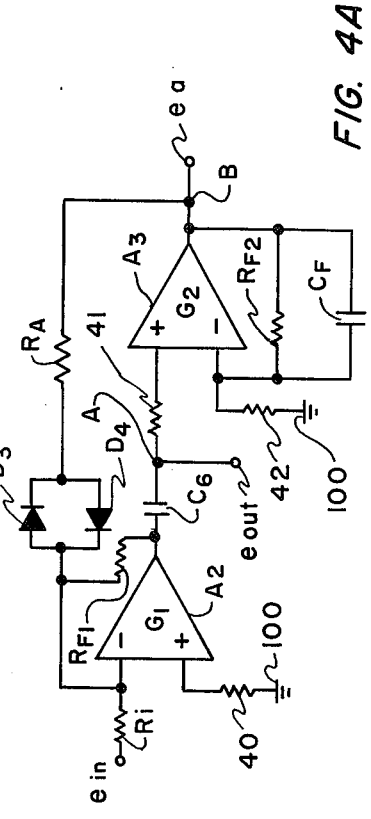

Refer to FIG. 4A wherein the first amplifier $A_2$ has an input $e_{in}$ applied to a negative input terminal and an output $e_{out}$ that is applied through capacitor C6 and resistor 41 to a positive input terminal of a second amplifier $A_3$. The output of amplifier $A_3$ is $e_a$, the value of $e_a$ being limited to the forward threshold voltage $\pm V_D$ of the diodes D3 and D4. The value of $e_{out}$ is $e_a$ divided by the gain $G_2$ of amplifier $A_3$. The value of $e_{out}$ in the cascaded amplifiers of FIG. 4A is therefore much less than $e_{out}$ of the one amplifier $A_1$ alone. FIG. 4B depicts, but not to scale, the reduced value of $e_{out}$ from the cascade amplifiers $A_2$ and $A_3$. If the gain $G_2$ of amplifier $A_3$ is set to be variable, the voltage $e_{out}$ limiting level will be variable also. The typical forward threshold voltage $V_D$ for a silicon diode, represented by diodes D3 and D4, is about 0.5 volts. If the gain $G_2$ of amplifier $A_3$ is set at 50, the $e_{out}$ limiting is $\pm 0.5$ volts divided by 50 or $\pm 10$ millivolts. This is generally within the dynamic range of the AC coupled video system. Capacitor $C_F$ and resistor $R_A$ are provided for system stability. Resistors $R_{F1}$ and $R_{F2}$ are feedback resistors respectively for amplifiers $A_2$ and $A_3$.

FIG. 5 illustrates a typical cascade feedback diode limiter 70 of this invention and shown in the electrical schematic of FIG. 2. The circuit has a feedback limiter comprised of back-to-back diodes D7 and D8 and a leakage current decoupler 56 comprised of back-to-back diodes D5 and D6 and a drain resistor $R_D$ connected to ground terminal 100. Circuit 56 minimizes the diode leakage current feedback through circuit 58 and resistor 54 to the amplifier $A_4$ input by sinking the current to ground 100 through resistor $R_D$. The voltage $e_{out}$ is picked off at an output voltage terminal between amplifiers $A_4$ and $A_5$. Actually two terminals are involved and are shown in FIG. 2 as a first output composite voltage terminal 7 and a second output composite voltage terminal 8.

Look now at FIG. 2 wherein the electrical schematic is explained with reference to the limiting signal, representing saturation, and the unlimiting signal that is within the dynamic range of the system. The unlimiting signal is shown throughout the channels of the video processor as being immediately over the limiting signal. First, assume that the input signal $e_{in}$ is below the limiting level, i.e. the unlimiting signal. The input signal $e_{in}$ is applied to both a first high pass filter 62 and to the negative terminal of the first post amplifier $A_4$ of the cascade feedback diode limiter 70. Only the high frequency portion of $e_{in}$ is passed through filter 62 with leading and trailing edge spikes, and this signal is then amplified by amplifier 60 and applied to a first negative input terminal of second post amplifier 28. Meanwhile, input signal $e_{in}$ has been amplified by first post amplifier $A_4$, which has the same gain, represented by $G_1$, as amplifier 60. The output of $A_4$ is applied to a variable pedestal limiting amplifier $A_5$ that establishes the amplitude of the signal $e_{out}$ existing at terminals 7 and 8 between the cascaded amplifiers $A_4$ and $A_5$. Thus the voltage $e_{out}$ contains the high frequency detail on the low frequency components when the signal $e_{in}$ was not saturated. Signal $e_{out}$ is applied to a second high pass filter 64, which is matched to the first high pass filter 62. The output from filter 64 is applied to a positive terminal of said second post amplifier 28, thus cancelling the signal from amplifier 60 applied to the first negative input terminal amplifier 28. Amplifier 28 also has a second negative input terminal into which $e_{out}$ is directly applied. The output of second post amplifier 28 is then an amplified $e_{out}$ signal. Polarity control and gain control are applied to amplifier 28 to control polarity and gain. The function of the AGC circuit 30 has been explained above.

When the input signal $e_{in}$ is in the limiting mode, the input signal goes through the same paths as the unlimiting signal but the operations performed are somewhat different. The input signal is band stopped in filter 62 leaving only the high frequency detail with spikes at the leading and trailing edges to be amplified in 60 and applied to the first negative input terminal of 28. The input signal $e_{in}$ is amplified in first post amplifier $A_4$ and is amplitude limited at terminals 7 and 8 between amplifiers $A_4$ and $A_5$ in the same manner as explained above. It must be noted, however, that the amplitude limited output signal $e_{out}$ does not contain any high frequency detail since the signal $e_{in}$ was saturated in amplifier $A_4$ and the high frequency detail was lost therein. The amplitude limited output signal $e_{out}$ is simultaneously fed through filter 64 to the positive input terminal of 28. Analyzing the three inputs to second post amplifier 28 shows that the signals on the first and second negative input terminals add to the high frequency detail superimposed on the limited output signal $e_{out}$ and that the signal from filter 64 applied to the positive input terminal is negligible. Therefore, the amplitude limited signal with the high frequency detail added thereon is amplified in the second post amplifier 28 and is presented to the LED driver 32 as an unsaturated signal. Looking at FIG. 1, the output signal W from amplifier 28 is shown with the high frequency detail, HF, amplified since the HF components are amplified even though the LF components are limited.

I wish it to be understood that I do not desire to be limited to the exact details of construction shown and described, for obvious modifications will occur to a person skilled in the art.

I claim:

1. A means for expanding the dynamic range of video signals in an AC coupled FLIR video processing system, said means comprising:
   an input video signal processing circuit for processing an input video signal which is comprised of a low frequency pedestal component and high frequency detail into a preamplified video signal;
   a scene dynamic range expander circuit comprising an automatic low frequency gain limiting and first post amplifier circuit in each of a plurality of video channels for simultaneously limiting the amplitude of said low frequency pedestal components and amplifying said high frequency detail to produce high frequency detail contained low amplitude pedestal signals therefrom and a second post amplifier in each of said plurality of video channels wherein said high frequency detail contained low amplitude pedestal signals are applied thereto for amplification to the dynamic range limits at the outputs therefrom and an automatic gain control circuit which is connected between the output and internal bias circuits of a selected number of said second post amplifiers in each of said plurality of video channels and feeds back control voltages to the selected number of said second post amplifiers for expanding the largest amplitude low frequency pedestal components of said high frequency detail contained low amplitude pedestal signals at the outputs of said selected number of said second post amplifiers to the maximum dynamic range of said video processing system; and
   an output video signal display circuit that receives and processes said low frequency dynamic range limited and amplified high frequency detail signal into a visible output display.

2. A means as set forth in claim 1 wherein said output video signal display circuit comprises a plurality of light emitting diode drivers having the maximum dynamic range high frequency detail contained low amplitude pedestal signals applied as inputs thereto and a plurality of light emitting diodes at outputs therefrom whose light output is controlled by said plurality of light emitting diode drivers.

3. A means as set forth in claim 2 wherein the selected number of said second post amplifiers which has the automatic gain control circuit connected between the output and internal bias circuits is every third of said second post amplifier.

4. A means as set forth in claim 2 wherein said automatic gain control circuit is connected between the output and internal bias circuits of all of said second post amplifiers.

5. A means as set forth in claim 4 wherein said scene dynamic expander circuit more specifically comprises:
   a cascade feedback diode limiter, said cascade feedback diode limiter further comprised of a first post amplifier which receives said preamplified video signal at its input and a variable pedestal limiting amplifier in cascade with a first output composite voltage terminal and a second output composite voltage terminal having a coupling capacitor therebetween and a feedback limiter circuit and leakage current decoupler circuit serially connected from the output of said variable pedestal limiting amplifier to the input of said first post amplifier for preventing leakage current from flowing back into the input of said first post amplifier when there is no voltage at the output of said variable pedestal limiting amplifier whereby a low frequency component of said preamplified video signal is produced at said first and second output composite voltage terminals that is amplitude limited by a division of the gain of said variable pedestal limiting amplifier and has high frequency detail thereon if not saturated with said first post amplifier or is void of high frequency detail if saturated within said first post amplifier;
   a first high pass filter and an amplifier that has the same gain as the gain of said first post amplifier, said first high pass filter and amplifier serially corrected between the output of said preamplifier and a first negative terminal of said second post amplifier whereby only the high frequency portion of said preamplified composite video signal is passed by said first high pass filter and is amplified by said amplifier;

a second high pass filter that is matched with said first high pass filter, said second high pass filter connected between said first output composite voltage terminal and a positive input terminal to said second post amplifier whereby only high frequency detail is applied to said positive input terminal of said second post amplifier when said preamplified composite video signal is not saturated within said first post amplifier and only a smooth voltage containing no high frequency detail thereon is applied to the positive input terminal of said second post amplifier when said preamplified video signal is saturated with said first post amplifier; and a direct connection between said second output composite voltage terminal and a second negative input terminal of said second post amplifier whereby the amplitude limited signal containing the high frequency detail thereon if unlimited and does not contain said high frequency detail if limited wherein in the unlimited mode of operation the signals at said first negative input terminal and said positive input terminal include only the high frequency detail and at said second negative input terminal both the amplitude limited low frequency pedestal with the high frequency detail thereon is applied with the resulting output from said second post amplifier being within the dynamic range and wherein in the limited mode of operation the high frequency detail is only present at said first negative input terminal with the smooth amplitude limited pedestal at the positive input terminal for raising the output to a perceivable scene level.

* * * * *